(12) United States Patent
Röhrl et al.

(10) Patent No.: US 12,274,011 B2
(45) Date of Patent: Apr. 8, 2025

(54) EXTENSION KIT

(71) Applicant: Vertiv S.r.l., Padua (IT)

(72) Inventors: Max Röhrl, Eichendorf (DE); Alfons Kaltenberger, Simbach (DE); Siegfried Schneiderbauer, Rossbach (DE)

(73) Assignee: VERTIV S.R.L., Piove di Sacco (IT)

( * ) Notice: Subject to any disclaimer, the term of this patent is extended or adjusted under 35 U.S.C. 154(b) by 246 days.

(21) Appl. No.: 17/833,270

(22) Filed: Jun. 6, 2022

(65) Prior Publication Data

US 2023/0007795 A1 Jan. 5, 2023

(30) Foreign Application Priority Data

Jun. 30, 2021 (DE) ...................... 10 2021 116 812.0

(51) Int. Cl.
*H05K 5/00* (2006.01)
*H05K 5/02* (2006.01)

(52) U.S. Cl.
CPC ................................. *H05K 5/0217* (2013.01)

(58) Field of Classification Search
CPC ...... H05K 5/0217; H05K 5/0213; H05K 5/03; A47B 45/00; G06F 2200/1635; G06F 2200/1639; G06F 1/181; G06F 1/20; G06F 1/182; G06F 1/1601; G06F 2200/201
USPC ....... 312/223.1, 265.1–265.6, 205, 111, 198; 454/184
See application file for complete search history.

(56) References Cited

U.S. PATENT DOCUMENTS

| | | | | | |
|---|---|---|---|---|---|
| 7,255,640 | B2 * | 8/2007 | Aldag | ................ | H05K 7/20572 361/679.48 |
| 8,659,905 | B2 * | 2/2014 | Knoop | ................. | H05K 7/1495 312/265.3 |
| 8,985,716 | B2 * | 3/2015 | Lundrigan | ........... | A47B 47/021 312/265.3 |
| 10,447,107 | B2 * | 10/2019 | Miller | ...................... | H02K 9/02 |
| 2004/0080244 | A1 * | 4/2004 | Lowther, Jr. | ........... | A47B 57/10 312/223.1 |
| 2010/0308703 | A1 * | 12/2010 | Schell | ..................... | H02B 1/21 312/265.1 |

(Continued)

FOREIGN PATENT DOCUMENTS

| CN | 201709043 | | 1/2011 |
|---|---|---|---|
| CN | 115279076 | A * | 11/2022 |

(Continued)

OTHER PUBLICATIONS

European Search Report, European Patent Application No. 22174575.5, mailed Nov. 18, 2022.

*Primary Examiner* — Janet M Wilkens
(74) *Attorney, Agent, or Firm* — HARNESS, DICKEY & PIERCE, P.L.C.

(57) ABSTRACT

An extension kit for an IT equipment cabinet is disclosed. The extension kit has two vertical profiles, two transverse profiles and four depth profiles. The two vertical profiles and the two transverse profiles form a rectangular frame, wherein each depth profile is fastened to the frame with one of its ends. In addition, two adapter profiles are provided, which are arranged parallel to the vertical profiles on the other ends of the depth profiles. These are designed to be fastened to an IT equipment cabinet to extend a depth of the cabinet without affecting its height or width.

10 Claims, 4 Drawing Sheets

(56) References Cited

U.S. PATENT DOCUMENTS

| | | | | |
|---|---|---|---|---|
| 2011/0115345 A1* | 5/2011 | Kang | ..................... | H02B 1/308 |
| | | | | 312/205 |
| 2012/0250261 A1* | 10/2012 | Peng | ................... | H05K 7/1489 |
| | | | | 312/223.1 |
| 2015/0091420 A1* | 4/2015 | Liu | ........................ | G06F 1/181 |
| | | | | 312/223.2 |
| 2022/0079335 A1* | 3/2022 | Alexander | .............. | H02G 3/22 |
| 2023/0122291 A1* | 4/2023 | Mohr | ..................... | G06F 1/182 |
| | | | | 312/133 |
| 2023/0261899 A1* | 8/2023 | Colton | ................... | H04L 12/46 |
| | | | | 370/242 |

FOREIGN PATENT DOCUMENTS

| | | | | | |
|---|---|---|---|---|---|
| DE | 4135108 | A1 | | 5/1993 | |
| DE | 19615468 | C1 | | 4/1996 | |
| DE | 19537015 | C1 | | 10/1996 | |
| DE | 19536925 | A1 | | 4/1997 | |
| DE | 20118727 | U1 | | 2/2002 | |
| GB | 2427511 | A | * | 12/2006 | ............ A47B 45/00 |
| WO | WO-2008110391 | A2 | | 9/2008 | |

\* cited by examiner

EXTENSION KIT

FIELD

The invention relates to an extension kit for an IT equipment cabinet.

BACKGROUND

IT equipment cabinets are used in data centres to house IT equipment, for example. Examples of this are servers, network components and uninterruptible power supplies. It is common for data centres to be equipped with appropriate IT equipment cabinets in which IT equipment or IT components are installed depending on the intended use. As IT equipment cabinets have a much longer lifespan than the IT equipment itself, it may be that the cabinets no longer have the necessary dimensions to accommodate new IT equipment. It may also be necessary, for example, to accommodate additional equipment in an IT equipment cabinet. An example of this is a larger and uninterruptible power supply or an additional network component.

Until this point, IT equipment cabinets often had to be replaced in this case, which is associated with increased costs and effort.

The object of the invention is therefore to address a possibility to increase the size of IT equipment cabinets.

SUMMARY

In one aspect the present disclosure relates to an extension kit for an IT equipment cabinet. The extension kit may comprise two vertical profiles, two transverse profiles and four depth profiles. The two vertical profiles and the two transverse profiles form a rectangular frame having two lower and two upper contact regions between respective ones of the vertical profiles and respective ones of the transverse profiles. Each of the depth profiles is fastened to one of the four contact regions with one of its ends. Further included are two adapter profiles. One of the two adapter profiles is fastened parallel to each vertical profile on the other end of two depth profiles and is designed for fastening to the IT equipment cabinet.

DETAILED DESCRIPTION

Figure 1:
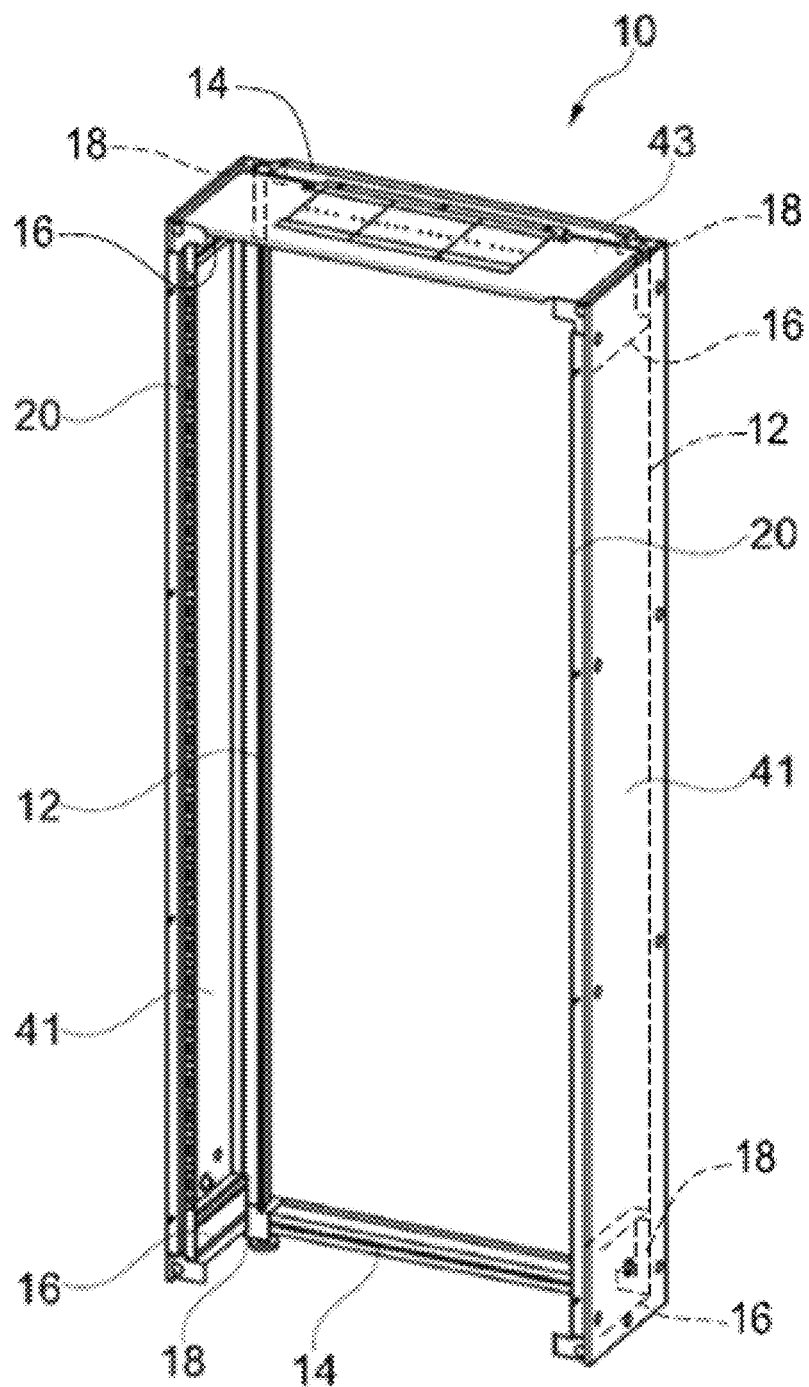
FIG. 1 shows a perspective view of the extension kit according to the invention.

The present disclosure relates to an extension kit for an IT equipment cabinet. In one aspect the extension kit has two vertical profiles, two transverse profiles and four depth profiles. The two vertical profiles and the two transverse profiles form a rectangular frame, wherein two lower and two upper contact regions are formed in each case between one vertical profile and one transverse profile. These contact regions are located in the corners of each frame.

Each of the depth profiles is fastened to one of the four contact regions with one of its two ends. Furthermore, two adapter profiles are provided, wherein one adapter profile is fastened parallel to each vertical profile on the other end of two depth profiles. The adapter profiles are used for fastening to an IT equipment cabinet and are designed accordingly.

According to the invention, it has been recognised that it is advantageous not to provide a new IT equipment cabinet, but to extend existing IT equipment cabinets. To achieve this, the underlying construction of an IT equipment cabinet is again incorporated so that the extension kit essentially has a cuboid outer structure. However, it is missing two transverse profiles.

The necessary stability of the extension kit is achieved by connecting the adapter profiles to the IT equipment cabinet. In this respect, the two transverse profiles of the IT equipment cabinet facing the extension kit also form the necessary transverse profiles for the extension kit in order to ensure sufficient stability.

It is advantageous if the cross-section of the vertical profiles and the cross-section of the transverse profiles are the same. In other words, the same profiles can be used with different lengths. This facilitates storage and also makes a flexible set-up possible.

The contact regions can be of any design. It is advantageous if an identical corner connector is provided in each. This corner connector is designed in such a way that it has one receptacle or connection region each for a vertical profile, for a transverse profile and for a depth profile. If the vertical and transverse profiles have the same basic profile, identical corner connectors can be used for all four contact regions.

In principle, the vertical profiles, the transverse profiles and/or the depth profiles can be connected to the corner connectors or to each other by means of any fastening means. A detachable fastening is preferred, for example, in the form of a screw or a clamp connection.

The adapter profile is preferably designed such that it corresponds to the vertical profiles of the IT equipment cabinet, i.e., makes fastening thereto possible. For example, the adapter profile can have, at least in its start and end region, an S-shaped, mirrored S-shaped, U-shaped or C-shaped cross-section. In these regions, it can be attached to the corresponding corner connectors of the IT equipment cabinet.

The S-shaped or mirrored S-shaped cross-section of the adapter profile can have one inner leg, two outer legs and two connecting legs, for example. In this case, a first end of the first outer leg can be connected to a first end of the inner leg by means of the first connecting leg. A second end of the inner leg can be connected to a first end of the second outer leg by means of the second connecting leg.

The U-shaped or C-shaped cross-section of the adapter profile can have two outer legs and one connecting leg, for example. In this case, a first end of the first outer leg can be connected to a first end of the second outer leg by means of the connecting leg.

Fastening openings can be provided in the two outer legs. These are used, for example, to fasten the adapter profile to the IT equipment cabinet and to fasten the adapter profile to the depth profiles of the extension kit.

It is thus advantageous if the connecting legs are dimensioned such that they allow access to the fastening openings of the outer legs. Hereby, the dimensioning is such that it is possible to insert and tighten screws in order to attach the extension kit to the IT equipment cabinet by means of the adapter profile or to attach the adapter profiles to the depth profiles.

The flexibility of the extension kit is further increased if the adapter profile has fastening holes for fastening IT equipment at least between its start and end regions. In particular, these can have a spacing according to the HE standard. This makes it possible to also install IT equipment in the extension kit, which equipment can be fastened to the adapter profile on one side and to corresponding T-slots or fastening means on the vertical profiles on the other side.

In another aspect the invention further relates to an IT equipment cabinet having four vertical cabinet profiles 71, four transverse cabinet profiles 72 and four depth cabinet profiles 73. Together with eight preferably identical corner connectors, these form a cuboid frame structure of the IT equipment cabinet.

The IT cabinet according to the invention has a corresponding extension kit, as explained above, which is fastened to four corner connectors of a front or rear side of the IT equipment cabinet by means of the adapter profiles. In this way, it is possible to easily and efficiently increase the space provided by an IT equipment cabinet. In principle, the extension kit can also be attached to one of the sides.

Preferably, the vertical profiles and the vertical cabinet profiles have a same cross-section. It is also possible that, additionally or alternatively, the transverse profiles and the transverse cabinet profiles have a same cross-section. Analogously, the depth profiles and the depth cabinet profiles can have a same cross-section Furthermore, it is preferable if the corner connectors of the IT equipment cabinet and the extension kit are designed identically.

Such dimensioning and construction ensures that components developed for the IT equipment cabinet itself can also be integrated into the extension kit. For example, this applies to side panels, doors and shelves or the like that can be mounted in the interior.

In the following, the invention is described in more detail using a schematic exemplary embodiment with reference to the figures.

Figure 3:
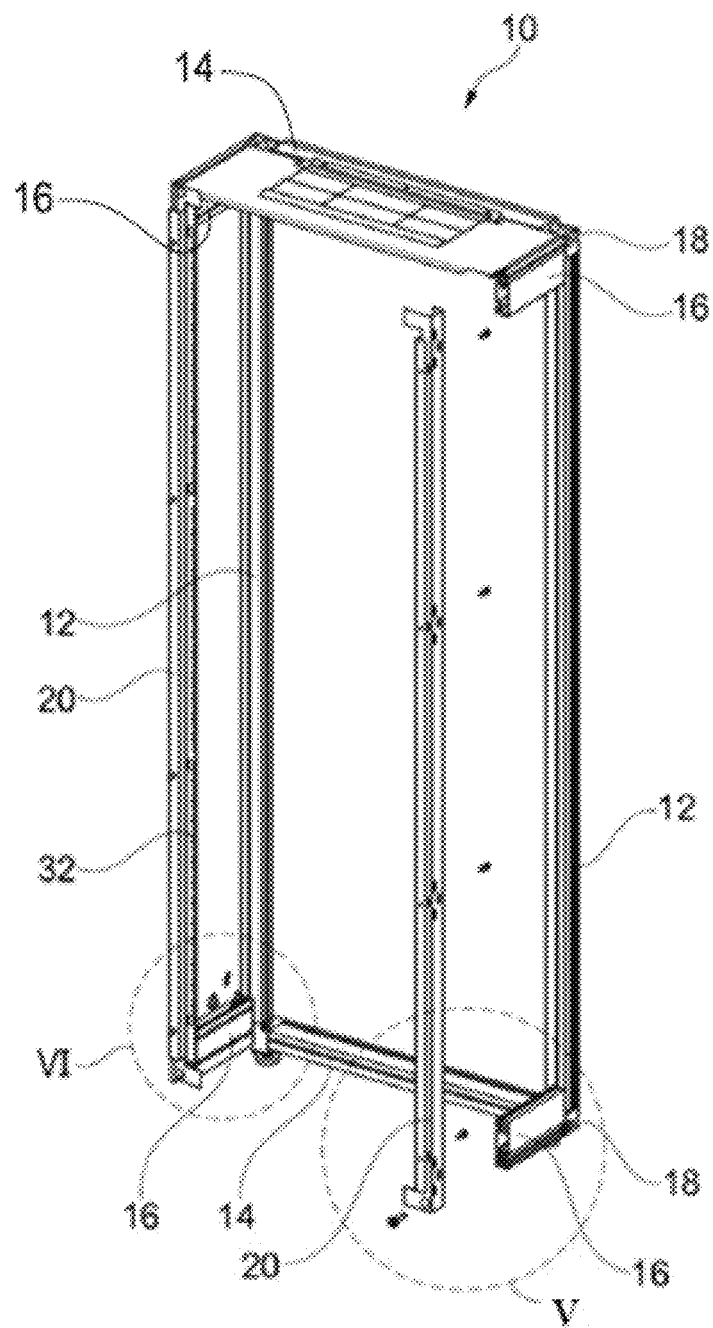
FIG. 3 shows a partially exploded view of an extension kit according to the invention.

FIGS. 1 and 3 show perspective views of the extension kit 10 according to one embodiment of the invention for an IT equipment cabinet 70. The extension kit 10 essentially consists of two vertical profiles 12, two transverse profiles 14 and four depth profiles 16. One vertical profile 12, one transverse profile 14 and one depth profile 16 are each connected to a corner connector 18 in a first contact region. The other vertical profile 12, the one transverse profile 14 and another one of the other depth profiles 16 are all each connected to another corner connector 18 in a second contact region. An adapter profile 20 is fastened to each of two ones of the depth profiles 16 so that it extends substantially parallel to a vertical profile 12.

Figure 2:
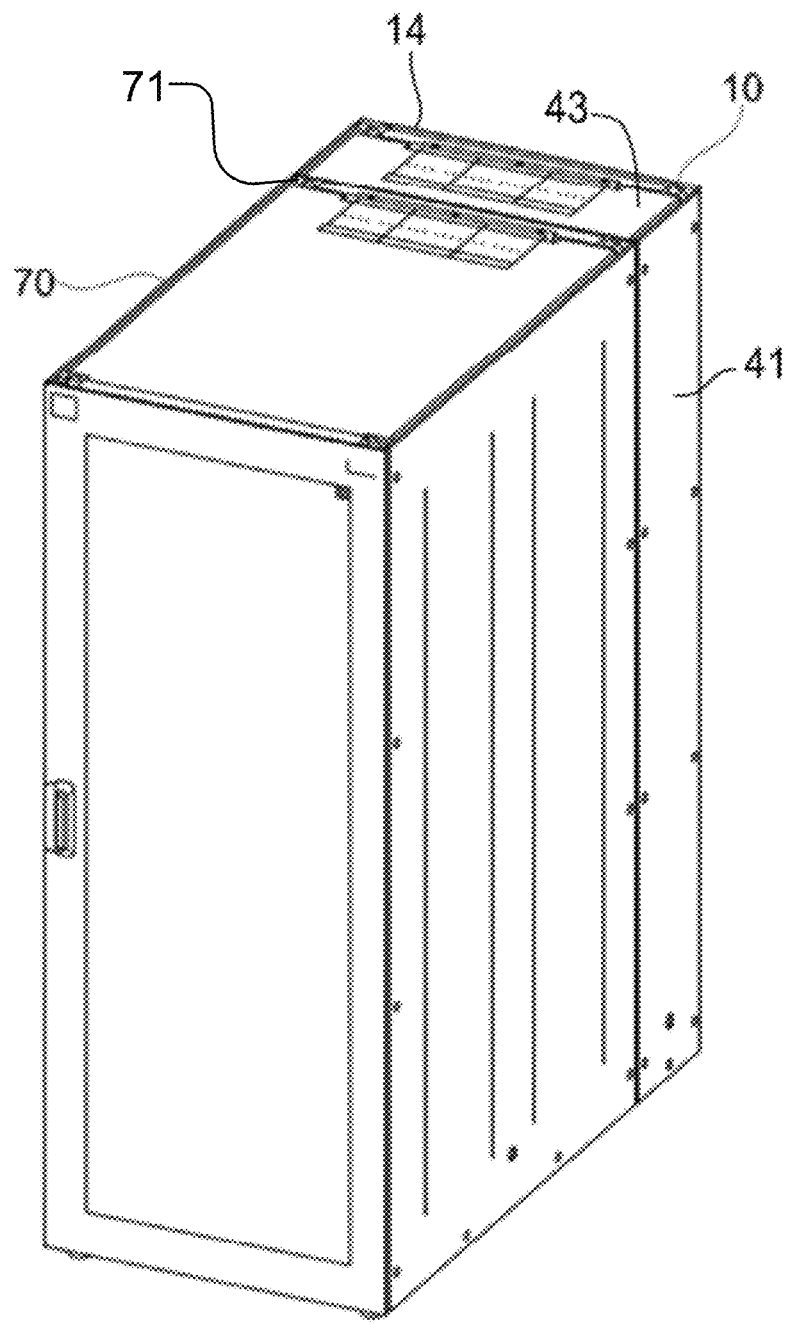
FIG. 2 shows an IT equipment cabinet with the extension kit according to the invention.

In the embodiment shown here, both sides are closed with corresponding facings 41, as can be seen in FIGS. 1 and 2. These can also be referred to as side walls. The facings 41 can be fastened to the vertical profiles 12, the depth profiles 16 and/or to the adapter profile 20. Analogously, a cover 43 is also provided, which closes off the extension kit 10 at the top. This in turn can be fastened to the corresponding depth profiles 16 and the transverse profiles 14.

FIG. 2 shows an overview of an extension kit 10, which is connected to an IT equipment cabinet 70. This would create a larger interior space to accommodate additional IT equipment. As shown, the extension kit 10 also extends the IT equipment cabinet 70 visually and without forming edges, as the extension kit 10 has essentially the same height and width as the IT equipment cabinet 70. Here, the vertical profiles 12 and the transverse profiles 14 of the extension kit 10 can be identical to those of the IT equipment cabinet 70, so for example have the same profile and the same length.

The extension kit 10 is shown in FIG. 3 analogously to FIG. 1. Here, one of the adapter profiles 20 is shown removed from the extension kit 10. As can be seen in particular from this representation, corresponding fastening holes 32 are provided on the adapter profiles 20 between the two end regions, which in particular have a spacing so that IT equipment can be fastened according to the HE standard. Such a fastening takes place between the adapter profiles 20 and the corresponding vertical profiles 12, which have a T-groove that can be used for fastening, for example.

Figure 4:
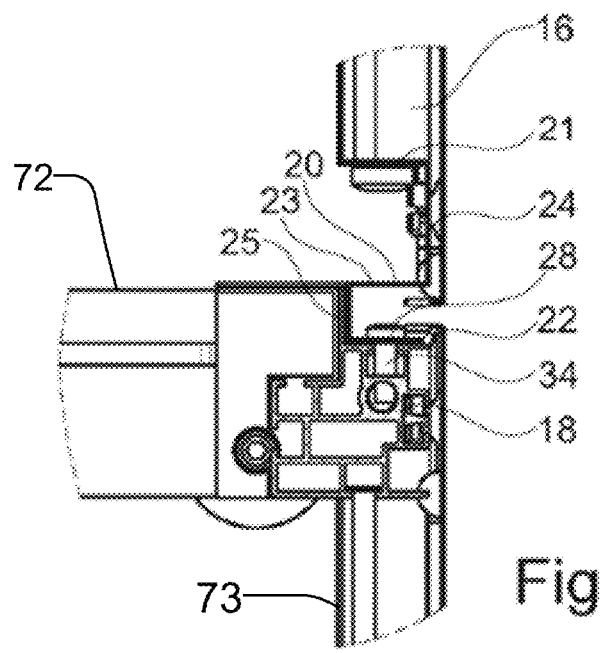
FIG. 4 shows a cross-section in the region of an adapter profile.

FIG. 4 shows a cross-section through the contact region between the extension kit 10 according to the invention and the IT equipment cabinet 70; in particular, the corner connector 18 of the IT equipment cabinet 70 is shown here. The adapter profile 20, which has an S-shape, is connected thereto. This shape is formed by a first outer web 21, adjoined by a first connecting web 24. An inner web 23 is provided at the end of this first connecting web 24. At the opposite end of the inner web 23 a second connecting web 25 is provided, which extends to a second outer web 22. This region of the adapter profile 20 can be produced by means of corresponding bending of a sheet metal component, for example. A fastening opening 28 is provided in the second outer web 22. The adapter profile 20 is fastened to the corner connector 18 by means of a screw 34. The fastening to the depth profile 16 can also be carried out in a similar manner.

Figure 5:
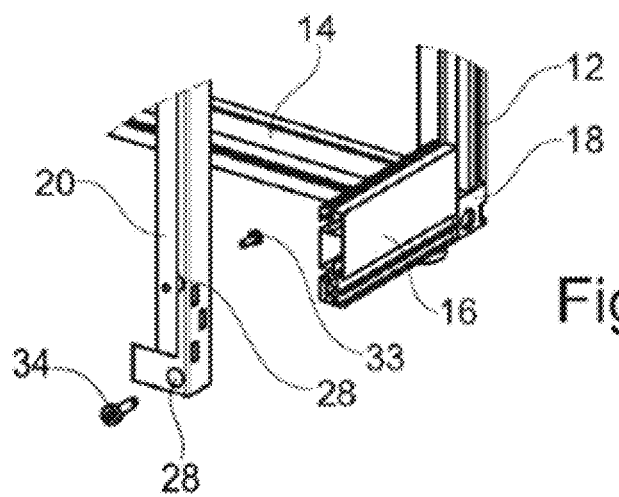
FIG. 5 shows an enlargement of the region V from FIG. 3.

FIG. 5 shows an enlargement of the region V from FIG. 3. Here it is illustrated how the adapter profile 20 is fastened to the depth profile 16 and to the corner connector 18 of the IT equipment cabinet 70 (not shown). This again takes place be means of the screw 34 already mentioned as well as by means of a second screw 33. A corresponding counterpart can be provided on the corner connector 18 for this purpose or a thread can be provided in the corner connector itself. The fastening to the depth profile 16 can be carried out in a similar manner. The fastening can be realised, for example, by a corresponding thread in the depth profile 16 or by means of a clampable component.

Figure 6:
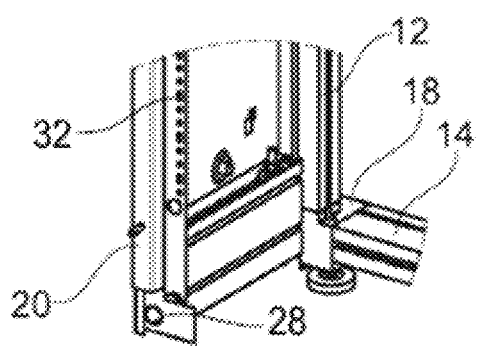
FIG. 6 shows an enlargement of the region VI from FIG. 3.

Finally, FIG. 6 shows an enlargement of the region VI from FIG. 3. Here it can be seen that the vertical profiles 12 and the transverse profiles 14 have the same profile and thus the same cross-section. This simplifies storage, as the corresponding profiles only have to be cut to length accordingly.

By means of the extension kit 10 according to the invention, it is possible to extend an IT equipment cabinet and thus to create a larger cabinet volume.

The invention claimed is:

1. An extension kit for an IT equipment cabinet, wherein the IT equipment cabinet has a height, a width and a depth, the extension kit comprising:
two vertical profiles,
two transverse profiles,
four depth profiles,
wherein the two vertical profiles and the two transverse profiles form a rectangular frame having four contact regions formed by two lower contact regions and two upper contact regions between respective ones of the vertical profiles and respective ones of the transverse profiles, wherein each of the depth profiles is fastened to one of the four contact regions with one of its ends,
two adapter profiles, wherein each one of the two said adapter profiles is fastened parallel to an associated one of said vertical profiles on the other ends of two of said depth profiles, wherein the adapter profiles are configured to be coupled to vertical surfaces of at least one of a rear portion or a front portion of the IT equipment cabinet in a manner which extends only the depth of the IT equipment cabinet, and such that the extension kit matches the height and width of the IT equipment cabinet; and wherein an identical corner connector is provided in each of the contact regions.

2. The extension kit according to claim 1, wherein a cross-section of the vertical profiles and the transverse profiles are the same.

3. The extension kit according to claim 1, wherein the vertical profiles, the transverse profiles and/or the depth profiles are directly or indirectly fastened to one another by means of screwing.

4. The extension kit according to claim 1, wherein the adapter profile has, at least in its start and end region, an S-shaped or mirrored S-shape.

5. The extension kit according to claim 4, wherein:
the S-shaped cross-section of the adapter profile has an inner leg and two outer legs as well as two connecting legs,
a first end of the first outer leg is connected to a first end of the inner leg by means of the first connecting leg,
a second end of the inner leg is connected to a first end of the second outer leg by means of the second connecting leg, and
fastening openings are provided in the two outer legs.

6. The extension kit according to claim 5, wherein the connecting legs are dimensioned such that they allow access to the fastening openings of the outer legs.

7. The extension kit according to claim 1, wherein the adapter profile has, at least between its start and end regions, fastening holes for fastening IT equipment.

8. The extension kit according to claim 1, further comprising:
an IT equipment cabinet having four vertical cabinet profiles, having four transverse cabinet profiles, having four depth cabinet profiles and having eight corner connectors, which form a cuboid frame of the IT equipment cabinet, and
wherein the extension kit is fastened to four corner connectors of a front or rear side of the IT equipment cabinet by means of the adapter profile.

9. The IT equipment cabinet according to claim 8, wherein:
the vertical profiles and the vertical cabinet profiles have a same cross-section, and/or
the transverse profiles and the transverse cabinet profiles have a same cross-section, and/or
the depth profiles and the depth cabinet profiles have a same cross-section, and/or
the corner connectors are designed identically.

10. An extension kit for an IT equipment cabinet, wherein the IT equipment cabinet has a height, a width and a depth, the extension kit comprising:
two vertical profiles,
two transverse profiles,
four depth profiles,
wherein the two vertical profiles and the two transverse profiles form a rectangular frame having four contact regions formed by two lower contact regions and two upper contact regions between respective ones of the vertical profiles and respective ones of the transverse profiles, wherein each of the depth profiles is fastened to one of the four contact regions with one of its ends,
two adapter profiles,
wherein each one of the two said adapter profiles is fastened parallel to an associated one of said vertical profiles on the other ends of two of said depth profiles,
wherein the adapter profiles are configured to be coupled to vertical surfaces of at least one of a rear portion or a front portion of the IT equipment cabinet in a manner which extends only the depth of the IT equipment cabinet, and such that the extension kit matches the height and width of the IT equipment cabinet; and
wherein the adapter profile has, at least in its start and end region, an S-shaped or mirrored S-shape.

* * * * *